United States Patent [19]
Wu

[11] Patent Number: 6,136,636
[45] Date of Patent: Oct. 24, 2000

[54] METHOD OF MANUFACTURING DEEP SUB-MICRON CMOS TRANSISTORS

[75] Inventor: Shye-Lin Wu, Hsinchu, Taiwan

[73] Assignee: Texas Instruments - Acer Incorporated, Hsinchu, Taiwan

[21] Appl. No.: 09/291,265

[22] Filed: Apr. 14, 1999

Related U.S. Application Data

[63] Continuation-in-part of application No. 09/048,154, Mar. 25, 1998, Pat. No. 5,930,617.

[51] Int. Cl.[7] ...................... H01L 21/8238; H01L 21/336
[52] U.S. Cl. ......................... 438/231; 438/233; 438/305; 438/558; 438/564
[58] Field of Search .................................. 438/231, 233, 438/229, 232, 305, 306, 307, 558, 564, 592, 585

[56] References Cited

U.S. PATENT DOCUMENTS

| | | | |
|---|---|---|---|
| 5,391,508 | 2/1995 | Matsuoka et al. | 438/305 |
| 5,504,024 | 4/1996 | Hsu | 438/305 |
| 5,620,914 | 4/1997 | Hikida et al. | 438/596 |
| 5,648,287 | 7/1997 | Tsai et al. | 438/305 |
| 5,656,519 | 8/1997 | Mogami | 438/233 |
| 5,691,212 | 11/1997 | Tsai et al. | 438/297 |
| 5,710,054 | 1/1998 | Gardner et al. | 438/564 |
| 5,759,885 | 6/1998 | Son | 438/199 |
| 5,930,617 | 7/1999 | Wu | 438/233 |

*Primary Examiner*—Michael Trinh
*Attorney, Agent, or Firm*—Harness, Dickey & Pierce, P.L.C.

[57] ABSTRACT

The present invention includes forming nitrogen-doped amorphous silicon layer on the gate structure and on a pad oxide. Nitride spacers are formed on the side walls of the gate structure. Then, the nitride spacers and the cap nitride are both removed by wet etching. Next, an ion implantation is carried out to dope dopants into the gate and in the N well. Doped regions for the NMOS device are next formed in the P well by performing a further ion implantation. An oxidation is performed to convert the nitrogen-doped amorphous silicon layer to a nitrogen-doped oxide layer. An ultra-shallow source and drain junctions and the extended source and drain are obtained by using the amorphous silicon layer as a diffusion source. Next, nitrogen spacers on the side walls of the oxide are formed. The oxide on the top of the gate and uncovered by the spacers are removed during the etching to form spacers. Self-aligned silicide (SALICIDE) and polycide are respectively formed on the exposed substrate and gate.

19 Claims, 4 Drawing Sheets

METHOD OF MANUFACTURING DEEP SUB-MICRON CMOS TRANSISTORS

This is a continuation-in-part of application filed Mar. 25, 1998, Ser. No. 09/048,154, U.S. Pat. No. 5,930,617.

FIELD OF THE INVENTION

The present invention relates to semiconductor devices, and more specifically, to complementary metal-oxide-semiconductor (CMOS) devices.

BACKGROUND

For ultra large scale integrated (ULSI) circuit application, the dimensions of devices are scaled down to sub-micron or deep sub-micron range. Self-aligned silicided (SALICIDE) process is the popular method to reduce the resistance of the gate, source and drain. Thus, CMOS devices with the self-aligned silicided process can increase the operation speed.

A so-called SAS (stacked amorphous silicon) method disclosed by Wu is proposed as a dopant diffusion source to form source and drain. An ultra-shallow source and drain junctions can be obtained by using the amorphous silicon layer as a diffusion source and by thermally driving the ions into the substrate. An article relating to the matter has been published by S. L. Wu, et al., in IEEE Trans. Electron Devices, Vol. ED-40, p. 1797, 1993. In this paper, a high performance shallow junction diode is formed by using an SAS (stacked amorphous silicon) as the dopant diffusion source.

Recently, A Hori et al. proposed devices with ultra-shallow source and drain junction by using 5 KeV ion implantation and rapid thermal annealing. This method can be used to suppress the short channel effect. In this article, the source and drain extensions are fabricated by ion implantation to obtain ultra-shallow profile. (A. Hori, et al., in IEDM Tech. Dig., p.485, 1994, entitled "A 0.05 $\mu$m-CMOS with Ultra Shallow Source/Drain Junction Fabricated by 5 KeV Ion Implantation and Rapid Thermal Annealing".)

For ULSI circuits application, the thickness of the gate oxide is necessary to be scaled down to nanometer dimensions. Therefore, the reliability of the ultra thin oxide is a serious problem to the scaled devices. Typically, the reliability of the gate oxide is influenced by many factors, such as the hot carrier that is one of the major issues to degrade the performance of the devices such that even the supply voltage is reduced down to 2.5 V for 0.25 micron MOS. In order to provide reliable MOSFETs, many structures of the MOSFET have been proposed. For example, one of the prior art approaches to improve the hot carrier resistance is the use of a NICE (nitrogen implantation into CMOS gate electrode and source and drain) structure. The NICE structure is proposed by T. Kuroi, et al., in IEDM Tech. Dig., p. 325, 1993. In the structure, the surface channel PMOS with the p+ poly gate has been investigated in place of the buried channel with n+ poly gate. However, the high dose (higher than 4E15 atom/cm$^2$) nitrogen implantation will cause a drastic increase in the sheet resistance of poly-Si gate, therefore the performance of the devices will be degraded by this matter. One relating article is "Impact of Nitrogen Implantation on Highly Reliable Sub-Quarter-Micron Metal Oxide Field-Effect Transistors with Lightly Doped Drain Structure", S. Shimizu, et al., Jpn. J. Appl. Phys., vol. 35, p. 802, 1996.

The hot carrier degration in LDD n-MOS is caused by the generation of interface states or electron traps in the sidewall spacers. For the NICE structure, the nitrided gate oxide under the gate electrode is not effective in suppressing the generation of interface state electron traps. Thus, S. Shimizu proposed a NISW (nitrogen implantation in the silicon oxide sidewall spacers) structure to solve the aforesaid issue. The issue can be suppressed due to the dangling bonds and weakened bonds formed at the interface between the sidewall spacers and the silicon substrate are occupied by the segregated nitrogen atoms.

SUMMARY

In accordance with the present invention, a sub-micron CMOS device is provided. In one embodiment, a N-well and a P-well are created in a substrate using suitable processes. Subsequently, a thin oxide layer is formed on the substrate to act as the gate oxide. An undoped polysilicon layers is deposited by chemical vapor deposition on the gate oxide layer. Next, a silicon nitride layer is successively formed on the polysilicon layer to act as the anti-reflective coating (ARC). Then, the undoped polysilicon layer, ARC layer, and the oxide layer are patterned to form ultra short channel polysilicon gates on the P-well and N-well, respectively. A thermal annealing is performed to recover the etching damage in the substrate and generate a pad oxide layer on the surface of the polysilicon gate and the substrate. An nitrogen-doped amorphous silicon layer is formed on the gate structure and on the pad oxide by using the nitrogen in-situ doping process or the nitrogen ion implantation process. Nitride spacers are formed on the side walls of the gate structure. Then, the nitride spacers and the cap nitride are both removed by wet etching. The nitride spacers are used to form a L-shape composed of amorphous silicon adjacent to the gate structure during the anisotropical etching.

Next, an ion implantation is carried out to dope dopants into the gate and in the N well. Preferably, a low energy and high dosage implantation is applied for an embodiment. The boron or BF$_2$ or the combination thereof for the PMOS devices are implanted in the N well. The energy and dosage of the implantation are about 0.5 to 120 KeV, 5E14 to 5E16 atoms/cm$^2$, respectively. Doped regions for the NMOS device are next formed in the P well by performing a further ion implantation. The dopant preferably includes arsenic, phosphorus or the combination thereof for the NMOS devices.

An oxidation is performed in ambient containing oxygen to convert the nitrogen-doped amorphous silicon layer (L-shape structure) to a nitrogen-doped thermal silicon oxide layer. The oxide layer also extends on the upper surface of the gate and the exposed surface of the substrate. An ultra-shallow source and drain junctions and the extended source and drain adjacent to the gate structures are obtained by using the amorphous silicon layer as a diffusion source.

Next, nitrogen spacers on the side walls of the oxide are formed. The oxide on the top of the gate and uncovered by the spacers are removed during the etching to form spacers, thereby leaving L-shape structure on the side walls of the gate. Self-aligned silicide (SALICIDE) and polycide are respectively formed on the exposed substrate and gate. Then, a rapid thermal anneal (RTA) at 350 to 700 degrees centigrade in N$_2$ ambient is performed to react the sputtering metal with the polysilicon gates and the silicon substrate, thereby forming silicide on these portions. Then, a strip step is used to remove non-reactive metal on the side wall spacers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention proposes a novel method to fabricate the self-aligned silicided deep sub-micron meter CMOS transistors with an ultra-shallow extension source and drain junctions. The doped regions in the substrate are formed by one ion implantation and a diffusion layer having dopant. An ultra thin nitrogen doped film is introduced for achieving the above object. The detailed description can be seen as follows and in conjunction with the accompanying drawings.

Figure 1:
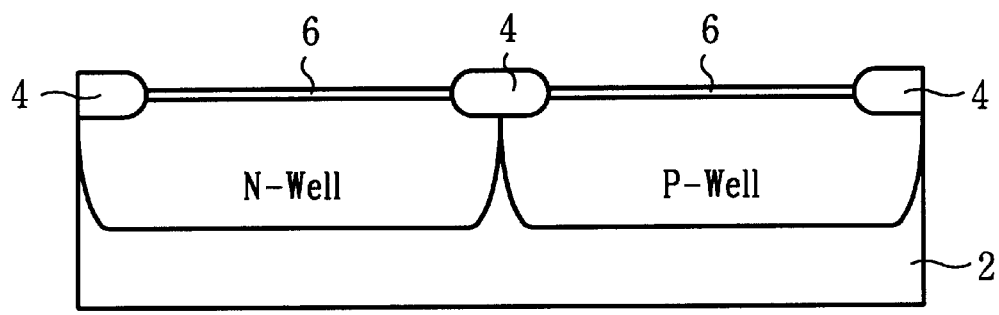
FIG. 1 is a cross-sectional view of a semiconductor substrate illustrating the step of forming a pad oxide layer on the semiconductor substrate according to the present invention.

Referring to FIG. 1, any suitable semiconductor material is provided as a substrate. For example, a single crystal substrate 2 with a <100> crystallographic orientation is used for the preferred embodiment. In this embodiment, thick field oxide (FOX) regions 4 are created for the purposes of isolation. Typically, the FOX regions 4 are created via a first photoresist and dry etching to define a silicon nitride-silicon dioxide composite layer. After the photoresist is removed and wet clean process, thermal oxidation in an oxygen ambient is performed to form the FOX regions 4, to a thickness of about 3000–8000 angstroms. The silicon nitride layer is then typically removed using hot phosphoric acid solution while the silicon dioxide is removed by using diluted HF or BOE solution. Then, twin-well regions (N well and P well) are formed in the substrate 2. Alternatively, a shallow trench isolation can be used to replace the FOX.

Subsequently, a thin oxide layer 6 is formed on the substrate 2 to act as a gate dielectric. In an embodiment, the gate dielectric layer 6 is composed of silicon oxide that is formed by using an oxygen-steam ambient, at a temperature between about 800 to 1100 degrees centigrade. Alternatively, the gate oxide 6 may be formed using other known oxide chemical compositions and procedures. For example, the gate oxide layer 6 can be silicon dioxide formed using a chemical vapor deposition process, with a tetraethylorthosilicate (TEOS) source, at a temperature between about 600 to 800 degrees centigrade and a pressure of about 0.1 to 10 torr. In one case, the thickness of the gate oxide layer 6 is about 15–200 angstroms. Furthermore, the nitride made by the JVD exhibits excellent electrical properties. The JVD nitride has lower leakage current than the one of oxide and it has high resistant to boron penetration. Therefore, ultra thin silicon nitride formed by jet vapor deposition (JVD) can be selected as the gate dielectric. The JVD nitride exhibit excellent electrical properties. Compared to thermal oxide, the JVD nitride has a lower leakage current and higher resistance to boron penetration. The JVD nitride can be deposited at room temperature using JVD technique, followed by annealing at about 800 to 850 centigrade degrees.

Figure 2:
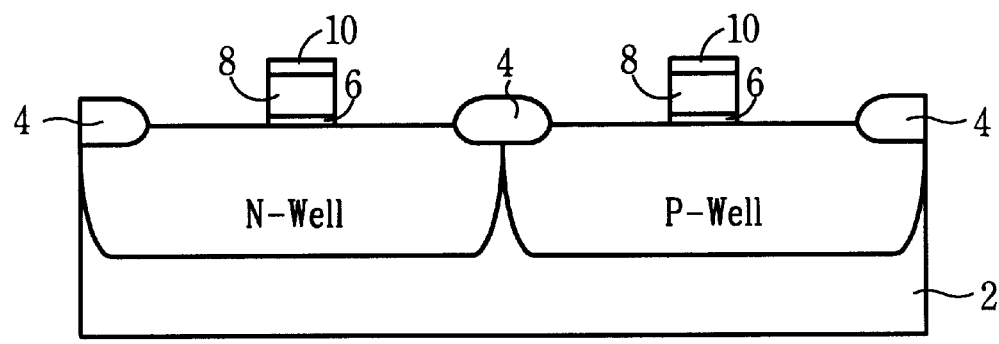
FIG. 2 is a cross-sectional view of a semiconductor substrate illustrating the step of forming gate structures on the semiconductor substrate according to the present invention.

Referring to FIG. 2, after the gate dielectric layer 6 is formed. An undoped polysilicon layer 8 is deposited by chemical vapor deposition on the gate oxide layer 6. Next, a silicon nitride layer 10 is successively formed on the polysilicon layer 8 to act as an anti-reflective coating (ARC) or cap layer. As is known in the art, the ARC will improve the lithography resolution. Then, the undoped polysilicon layer 8, the ARC layer 10 and the gate dielectric layer 6 are patterned to form ultra short channel silicon gate structures on the P-well and N-well, respectively. The dielectric layer 6 uncovered by the gate 8 is also removed.

Figure 3:
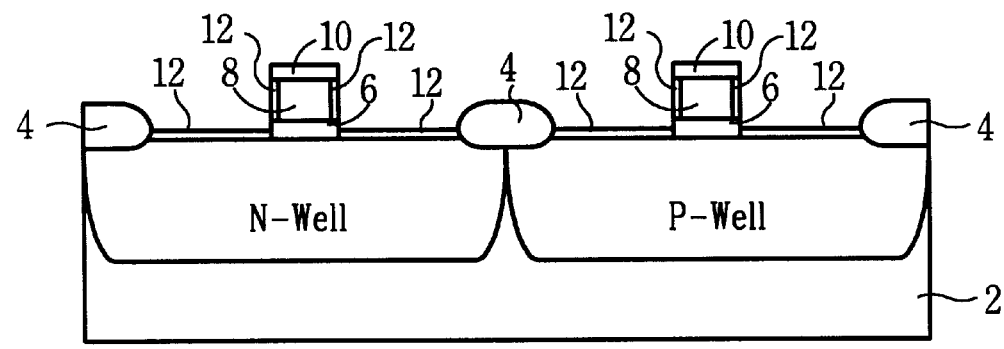
FIG. 3 is a cross-sectional view of a semiconductor substrate illustrating the step of performing a thermal annealing according to the present invention.

Turning to FIG. 3, a thermal annealing is performed at about 750 to 1100 degrees centigrade to recover the etching damage in the substrate 2, thereby generating an ultra-thin pad oxide layer 12 on the surface of the polysilicon gate 8 and on the surface of the substrate 2 that is not covered by the gate 8.

Figure 4:
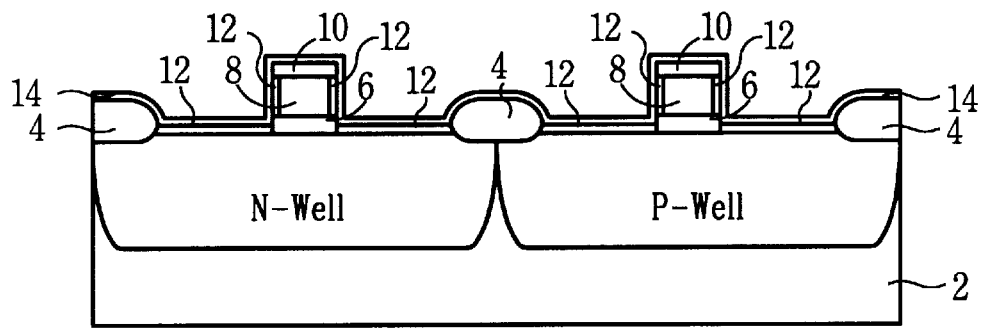
FIG. 4 is a cross-sectional view of a semiconductor substrate illustrating the step of forming a nitrogen-doped amorphous silicon layer on the semiconductor substrate according to the present invention.

Thereafter, referring to FIG. 4, an nitrogen-doped amorphous silicon layer 14 is subsequently formed on the gate structures and on the pad oxide 12. Preferably, this can be done by using a nitrogen in-situ doped poly buffer method proposed by T. Kobayashi, et al., in IEDM Tech. Dig., p. 683, 1994. In the step, the nitrogen in-situ doped amorphous silicon layer 14 is formed at 500 degrees centigrade with a $Si_2H_6$-$NH_3$ gas system. The concentration of the nitrogen is about 1E18-1E21 $cm^3$, and the thickness of the nitrogen in-situ doped amorphous silicon layer 14 is about 400 to 1500 angstroms. Alternatively, the nitrogen-doped amorphous silicon layer 14 can be formed by depositing an amorphous silicon, followed by performing an ion implantation containing nitrogen atoms to dope ions into the amorphous silicon layer, thereby forming the nitrogen-doped amorphous silicon layer 14. Another way, such as the methods that are mentioned in the background respectively proposed by A. Hori and T. Kuroi may be used herein. The nitrogen-doped amorphous silicon layer 14 exhibits two characteristics. The silicon layer remains a micro-crystal during oxidation, and further, oxidation rate of the nitrogen-doped amorphous silicon layer 14 is slower than non-doped silicon.

Figure 5:
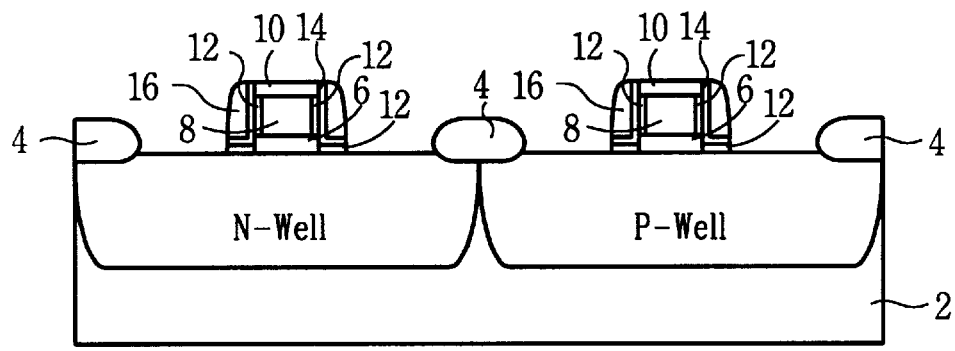
FIG. 5 is a cross-sectional view of a semiconductor substrate illustrating the step of forming an nitride spacers on the semiconductor substrate according to the present invention.
Figure 6:
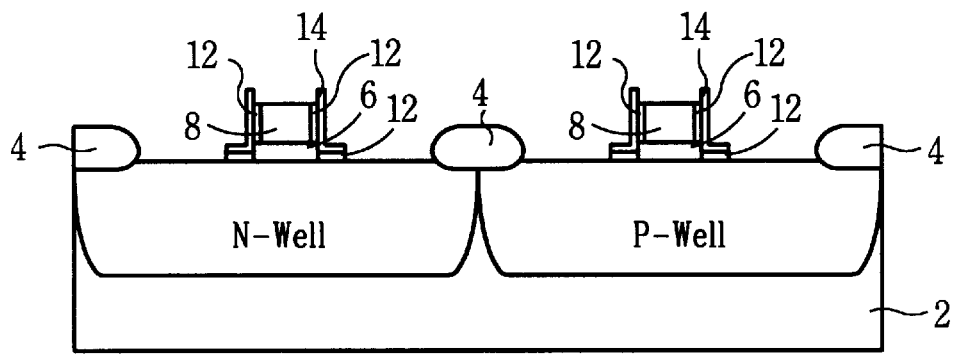
FIG. 6 is a cross-sectional view of a semiconductor substrate illustrating the step of removing the spacers and cap nitride according to the present invention.

Turning to FIG. 5, nitride spacers 16 are formed on the side walls of the gate structure. In order to obtain this structure, a nitride layer is deposited on the feature and followed by etching the nitride layer using an anisotropical etching technique. The nitride doped amorphous silicon layer 14 is also etched during the etching by controlling the etchant, thereby leaving a residual layer on the side walls of the gate and underlying the nitride spacers 16. Then, the nitride spacers 16 and the cap nitride 10 are both removed by wet etching including hot phosphorus acid solution. This is shown in FIG. 6. The nitride spacers 16 advantage to form a L-shape structure 14 composed of amorphous silicon adjacent to the gate structure during the anisotropical etching. Thus, a lateral portion of the L-shape structure is lying on the substrate adjacent to the gate 8. It is noted that the upper surface of the gate is exposed.

Figure 7:
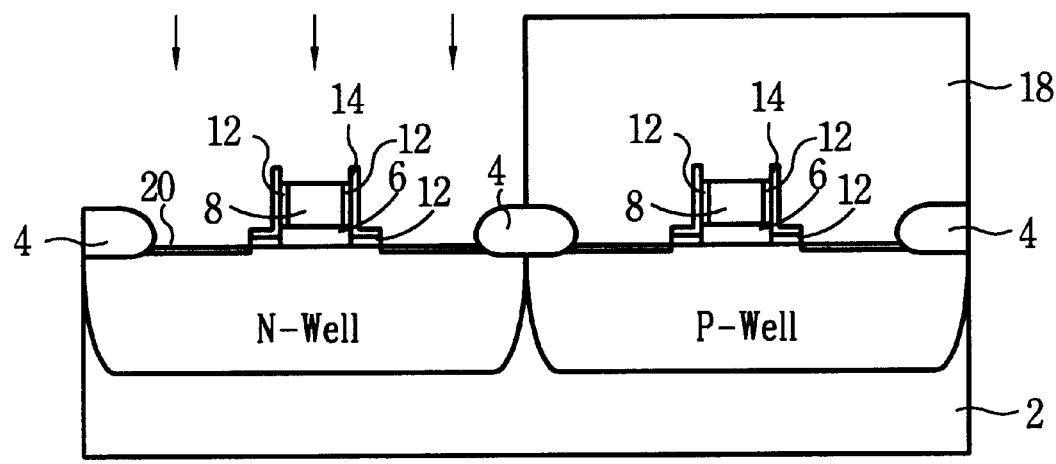
FIG. 7 is a cross-sectional view of a semiconductor substrate illustrating the step of performing a first ion implantation according to the present invention.

Next, an ion implantation is carried out to dope dopants into the gate 8 and in the N well by using a photoresist 18 as a mask to cover the P well, thereby forming doped regions 20 that are separated from the gate structure with a space about the width of the removed spacers 16. Specifically, it is about the thickness of the nitride layer 16, as shown in FIG. 7. Preferably, a low energy and high dosage implantation is applied for an embodiment. The boron or $BF_2$ or the combination thereof for the PMOS devices are implanted in the N well. The energy and dosage of the implantation are about 0.5 to 120 KeV, 5E14 to 5E16 atoms/cm$^2$, respectively. It has to be noted that the region under the lateral portion of the L-shape structure 14 has a dosage that is lower than the area uncovered by the gate structure 8. Then, the photoresist 18 is removed.

Figure 8:
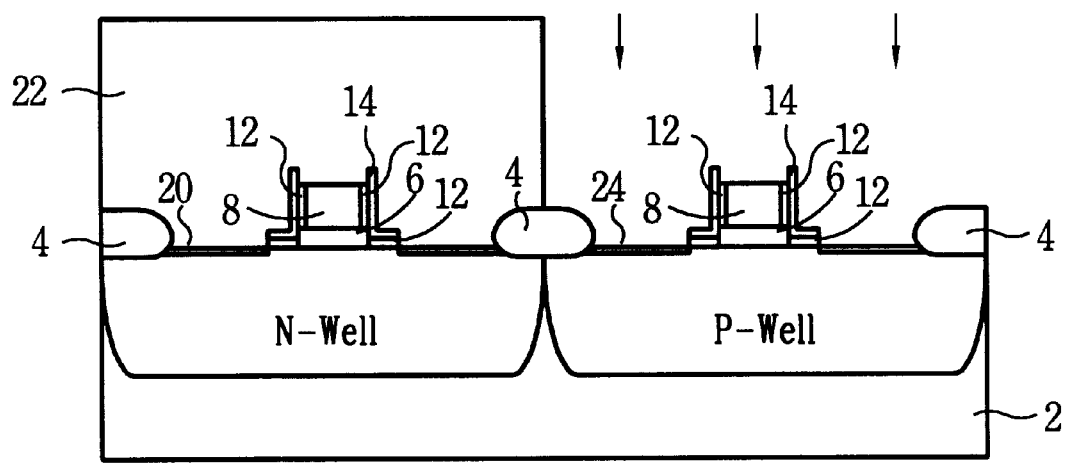
FIG. 8 is a cross-sectional view of a semiconductor substrate illustrating the step of performing a second ion implantation according to the present invention.

Turning to FIG. 8, doped regions 24 for the NMOS device are next formed in the P well by performing a further ion implantation by using a photoresist 22 as a mask. Similarly, the region under the lateral portion of the L-shape structure 14 has a dosage that is lower than the area uncovered by the gate structure 8. Then, the photoresist 22 is removed after the procedure. The dopant preferably includes arsenic, phosphorus or the combination thereof for the NMOS devices. As known to one skilled in the art, the above two ion implantation steps can be switched.

Figure 9:
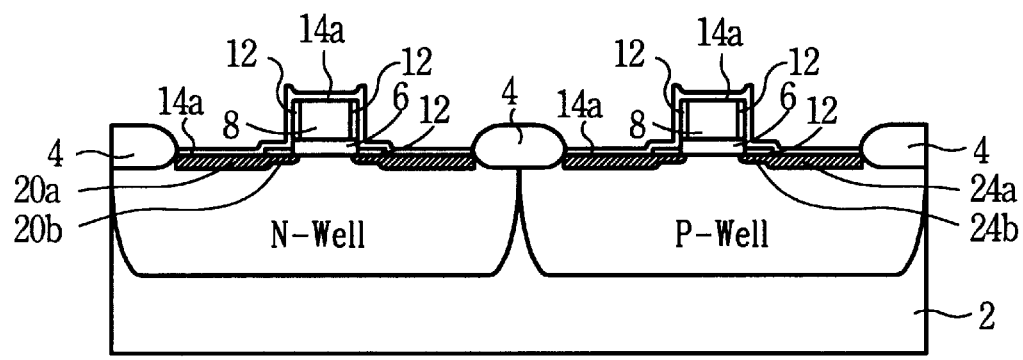
FIG. 9 is a cross-sectional view of a semiconductor substrate illustrating the step of performing a thermal oxidation according to the present invention.

Turning to FIG. 9, a steam oxidation is performed in ambient containing oxygen to convert the nitrogen-doped amorphous silicon layer (L-shape structure) 14 to a nitrogen-doped thermal silicon oxide layer 14a. The oxide layer 14a also extends on the upper surface of the gate 8 and the exposed surface of the substrate 2. In one case, the temperature for this step can range from 800 to 1150 degrees centigrade. Simultaneously, an ultra-shallow source and drain junctions 20a, 24a and the extended source and drain 20b, 24b adjacent to the gate structures are obtained by using the amorphous silicon layer 14 as a diffusion source and by driving the ions into the substrate by thermal process. An article relates to this matter was published by S. L. Wu, et al., in IEEE Trans. Electron Devices, Vol. ED-40, p. 1797, 1993. In this paper, high performance shallow junction diode is formed by using an SAS (stacked amorphous silicon) as the dopant diffusion source.

Figure 10:
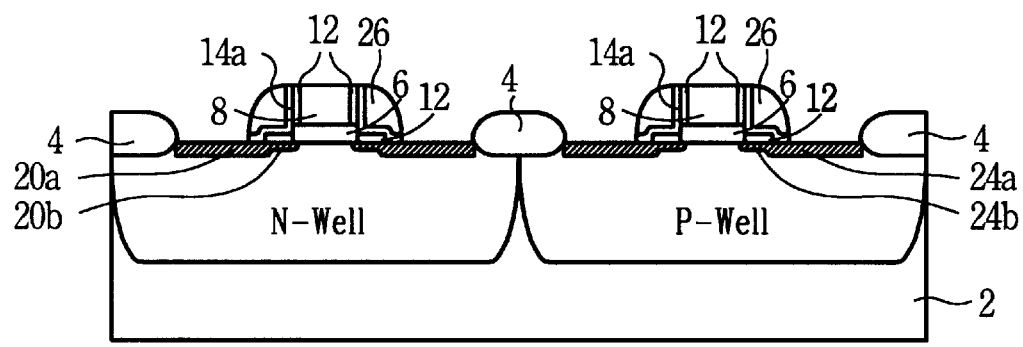
FIG. 10 is a cross-sectional view of a semiconductor substrate illustrating the step of forming nitride spacers according to the present invention.

Next, a nitride layer 26 is formed on the substrate 2 and the gate structure. Subsequently, the silicon nitride layer 26 is anistropically etched back to form nitrogen spacers 26 on the side walls of the oxide 14a. The resulting structure is illustrated in FIG. 10. The oxide 14a on the top of the gate and uncovered by the spacers 26 are removed during the etching, thereby leaving L-shape structure 14a composed of oxide on the side walls of the gate 8.

Figure 11:
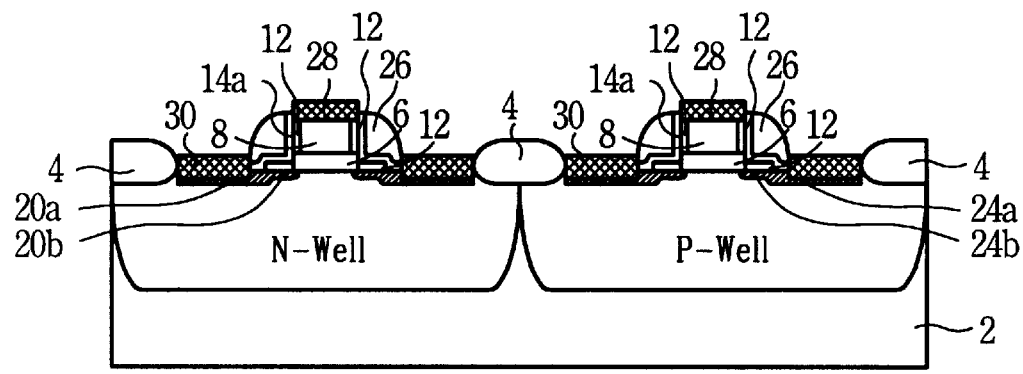
FIG. 11 is a cross-sectional view of a semiconductor substrate illustrating the step of forming silicide, polycide on the substrate and gates, respectively according to the present invention.

Turning to FIG. 11, self-aligned silicide (SALICIDE) 22 and polycide 24 are respectively formed on the exposed substrate 2 and the gate 8. Typically, this can be achieved by using well-known processes. For example, a refractory or noble metal layer 22, such as Ti, Pt, Co, W, Ni, Pd, Cr etc, is sputtered on the substrate 2, spacers 18 and gates 8. Then, a rapid thermal anneal (RTA) at 350 to 700 degrees centigrade in $N_2$ ambient is performed to react the sputtering metal with the polysilicon gates 8 and the silicon substrate 2, thereby forming silicide on these portions. Then, a stripping step is used to remove non-reactive metal on the side wall spacers 18. Therefore, the SALICIDE 30 and the polycide 28 are self-aligned formed on these regions.

As can be appreciated from the above disclosure, the present invention provides the following advantages: (1) The device performance can be improved by using the self-aligned silicide and extended source and drain junction technology; (2) ultra-shallow junction structures can be obtained using a diffusion source to suppress the short channel effect or reverse short channel effect, please (refer to an article by P. G. Y. Tsui, et al., in IEDM Tech. Dig., p. 501, 1994); and (3) the source, drain and the extended source and drain for NMOS or PMOS are simultaneously formed by only one ion implantation and a thermal process.

As is understood by a person skilled in the art, the foregoing embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a CMOS device on a semiconductor substrate, the method comprising:

forming a first oxide layer on said semiconductor substrate to act as a gate oxide;

forming an undoped polysilicon layer on said first oxide layer to act as gates of said CMOS;

forming a silicon nitride layer on said undoped polysilicon layer to act as an anti-reflective layer;

patterning said silicon nitride layer, said undoped polysilicon layer and said first oxide layer to form gate structures on said semiconductor substrate;

performing a thermal annealing to recover the etching damage of said semiconductor substrate caused by patterning said gate structures, and simultaneously forming a second oxide layer on the surface of said gate structures and on said semiconductor substrate uncovered by said gate structures;

forming a nitrogen doped amorphous silicon layer on said second oxide layer and said gate structures;

forming first spacers on sidewalls of said gate structures/ said nitrogen doped amorphous silicon layer;

removing said nitrogen doped amorphous silicon layer and said second oxide layer that are not covered by said first spacers;

removing said first spacers and said silicon nitride layer to expose said residual nitrogen doped amorphous silicon layer and upper surface of said undoped polysilicon layer;

performing an ion implantation to dope dopants into said gate structures and said semiconductor substrate, thereby forming source and drain regions in said semiconductor substrate with a spacer separated from said gate structures;

performing an oxidation procedure to convert said residual nitrogen doped amorphous silicon layer to a nitrogen doped oxide layer, simultaneously diffusing dopants in said nitrogen doped amorphous silicon layer to said semiconductor substrate, thereby forming extended source and drain junctions adjacent to said gate structures, wherein a third oxide layer is simultaneously formed by said oxidation procedure on exposed surfaces of said substrate and said gate structures;

forming second spacers on sidewalls of said gate structures/said nitrogen doped oxide layer;

removing said third oxide layer; and forming a self-aligned silicide (SALICIDE) on said semiconductor substrate and a polycide on said gates.

2. The method of claim 1, wherein said nitrogen doped amorphous silicon layer is formed by using in-situ doped process.

3. The method of claim 2, wherein said in-situ doped process is performed with $Si_2H_6$-$NH_3$ gas.

4. The method of claim 1, further comprising following steps to form said nitrogen doped amorphous silicon layer:

forming a amorphous silicon layer on said second oxide layer and said gate structures; and performing an ion implantation to dope nitrogen ions into said amorphous silicon layer.

5. The method of claim 1, wherein said thermal annealing is performed at a temperature about 750 to 1100 degrees centigrade.

6. The method of claim 1, wherein energy of said ion implantation is about 0.5 to 120 KeV.

7. The method of claim 1, wherein a dosage of said ion implantation is about 5E14 to 5E16 atoms/$cm^2$.

8. The method of claim 1, wherein dopants of said ion implantation is selected from a group consisting of arsenic, phosphorus and the combination thereof for nMOS devices, and is selected from a group consisting of boron, $BF_2$ and the combination thereof for pMOS devices.

9. The method of claim 1, wherein said oxidation procedure is performed at temperature about 800 to 1150 degrees centigrade.

10. The method of claim 1, wherein said oxidation procedure is performed in ambient containing oxygen.

11. The method of claim 1, wherein said silicon nitride layer is removed by using hot phosphorus acid solution.

12. The method of claim 1, wherein a concentration of the nitrogen ions in said nitrogen doped oxide layer is about 1E18–1E21 $cm^3$.

13. The method of claim 1, wherein a thickness of said nitrogen doped amorphous silicon layer is about 400 to 1500 angstroms.

14. The method of claim 1, further comprising the following steps to form said self-aligned silicide (SALICIDE) and said polycide:

forming a metal layer on said semiconductor substrate, said second spacers and said gate structures;

performing a thermal process to react said metal layer with said semiconductor substrate and said gate structures; and removing non-reactive portion of said metal layer.

15. The method of claim 14, wherein said metal layer is selected from a group consisting of Ti, Pt, Co, W, Ni, Pd and Cr.

16. The method of claim 14, wherein said thermal process is performed at temperature about of 350 to 700 degrees centigrade.

17. The method of claim 14, wherein said thermal process is performed in $N_2$ ambient.

18. The method of claim 1, wherein said first spacers are formed of nitride spacers.

19. The method of claim 1, wherein said second spacers are formed of nitride spacers.

* * * * *